United States Patent
Wang et al.

(10) Patent No.: US 12,150,363 B2
(45) Date of Patent: Nov. 19, 2024

(54) DISPLAY PANEL, DISPLAY SCREEN AND DISPLAY DEVICE HAVING LARGER VIEWING ANGLE

(71) Applicants: CHENGDU BOE OPTOELECTRONICS TECHNOLOGY CO., LTD., Sichuan (CN); BOE TECHNOLOGY GROUP CO., LTD., Beijing (CN)

(72) Inventors: Wenqiang Wang, Beijing (CN); Ao Huang, Beijing (CN); Peng Zhou, Beijing (CN); Liji Cheng, Beijing (CN); Sheng Guo, Beijing (CN); Jiandong Bao, Beijing (CN); Weilin Lai, Beijing (CN)

(73) Assignees: CHENGDU BOE OPTOELECTRONICS TECHNOLOGY CO., LTD., Beijing (CN); BOE TECHNOLOGY GROUP CO., LTD., Beijing (CN)

( * ) Notice: Subject to any disclaimer, the term of this patent is extended or adjusted under 35 U.S.C. 154(b) by 314 days.

(21) Appl. No.: 17/224,876

(22) Filed: Apr. 7, 2021

(65) Prior Publication Data
US 2022/0093690 A1    Mar. 24, 2022

(30) Foreign Application Priority Data
Sep. 23, 2020    (CN) .......................... 202011009434.X

(51) Int. Cl.
*H10K 59/38*    (2023.01)
*H10K 50/84*    (2023.01)
(Continued)

(52) U.S. Cl.
CPC ............. *H10K 59/38* (2023.02); *H10K 50/84* (2023.02); *H10K 50/865* (2023.02); *H10K 59/122* (2023.02); *H10K 59/50* (2023.02)

(58) Field of Classification Search
CPC ...... H10K 59/38; H10K 59/50; H10K 59/122; H10K 50/84; H10K 50/865
See application file for complete search history.

(56) References Cited

U.S. PATENT DOCUMENTS

| | | | | |
|---|---|---|---|---|
| 2009/0236976 A1* | 9/2009 | Lee | ..................... | H10K 59/8792 257/E33.044 |
| 2014/0035456 A1* | 2/2014 | Isa | ......................... | H10K 59/38 313/498 |

(Continued)

FOREIGN PATENT DOCUMENTS

| CN | 108899354 A | 11/2018 |
|---|---|---|
| CN | 109065754 A | 12/2018 |

(Continued)

OTHER PUBLICATIONS

Office Action for Chinese Patent Application No. 202011009434.X with machine translation (16 pages) (mailed Nov. 12, 2023).

*Primary Examiner* — Thao X Le
*Assistant Examiner* — Sean Ayers Winters
(74) *Attorney, Agent, or Firm* — Myers Bigel, P.A.

(57) ABSTRACT

Embodiments of the application provide a display panel, a display screen and a display device. The display panel includes a backplane, a color filter layer, and a black matrix between the backplane and the color filter layer. The backplane includes a base substrate, the color filter layer includes a plurality of sub-pixel color filters, and the plurality of sub-pixel color filters are arranged along a plane of the color filter layer and spliced together to form the color filter layer.

18 Claims, 7 Drawing Sheets

(51) Int. Cl.
*H10K 50/86* (2023.01)
*H10K 59/122* (2023.01)
*H10K 59/50* (2023.01)

(56) References Cited

U.S. PATENT DOCUMENTS

| | | | |
|---|---|---|---|
| 2017/0154930 A1* | 6/2017 | Kim | H10K 59/122 |
| 2018/0182814 A1* | 6/2018 | Kim | H10K 59/38 |
| 2018/0182819 A1* | 6/2018 | Jo | H10K 50/865 |
| 2018/0197921 A1* | 7/2018 | Kim | H10K 50/865 |
| 2018/0331326 A1* | 11/2018 | Woo | H10K 59/8792 |
| 2019/0165066 A1* | 5/2019 | Lee | H10K 59/873 |
| 2019/0187853 A1* | 6/2019 | Ding | G06F 3/016 |
| 2019/0326361 A1* | 10/2019 | Gwon | G06F 3/04164 |
| 2020/0119113 A1* | 4/2020 | Lee | G06F 3/0446 |
| 2020/0227486 A1* | 7/2020 | Liu | H10K 50/818 |
| 2020/0257162 A1* | 8/2020 | Lee | H10K 59/122 |
| 2020/0266392 A1* | 8/2020 | Lee | G06F 3/0412 |
| 2020/0296496 A1* | 9/2020 | Im | H04R 9/022 |
| 2021/0234134 A1* | 7/2021 | Qi | H10K 59/8792 |

FOREIGN PATENT DOCUMENTS

| | | | |
|---|---|---|---|
| CN | 110504383 A | 11/2019 | |
| CN | 111048691 A | 4/2020 | |

* cited by examiner

DISPLAY PANEL, DISPLAY SCREEN AND DISPLAY DEVICE HAVING LARGER VIEWING ANGLE

RELATED APPLICATION

The present application claims the benefit of Chinese Patent Application No. 202011009434.X filed with Chinese Patent Office on Sep. 23, 2020, the entire disclosure of which is incorporated herein by reference.

TECHNICAL FIELD

The present disclosure relates to the field of display technology, specifically to a display panel, a display screen and a display device.

BACKGROUND

Various display devices such as liquid crystal displays and organic light emitting displays have been widely used in industrial production and daily life. Organic light emitting displays, due to their unique advantages such as self-luminescence, rich colors, wide viewing angle and low power consumption, greatly cater to current requirements for users and have become one of the main research directions in the field of display technology. A liquid crystal display device comprises a color filter layer, and the color filter layer includes sub-regions of different colors (for example, red, green and blue), so that the display device forms sub-pixel regions displaying different colors. The color filter layer generally further includes a black matrix that separates different sub-pixel regions to avoid crosstalk between the sub-pixel regions. The materials of the black matrix and the sub-regions of the color filter layer are in the same layer. However, for current display products, regardless of liquid crystal displays or organic light emitting displays, there is space for improvement in the user's viewing experience.

SUMMARY

An embodiment of the present application provides display panel comprising: a backplane comprising a base substrate; a color filter layer; and a black matrix between the backplane and the color filter layer. The color filter layer comprises a plurality of sub-pixel color filters, and the plurality of sub-pixel color filters are arranged along a plane of the color filter layer and spliced together to form the color filter layer.

In some embodiments, the display panel further comprises a thin film encapsulation layer, the thin film encapsulation layer is located between the black matrix and the color filter layer and covers the black matrix.

In some embodiments, an orthographic projection of the black matrix on the base substrate covers an orthographic projection of a boundary between adjacent sub-pixel color filters of the plurality of sub-pixel color filters on the base substrate.

In some embodiments, the backplane further comprises a pixel definition layer and a plurality of light emitting elements on the base substrate, the pixel definition layer defines a plurality of cavities, respective ones of the plurality of light emitting elements are located in respective ones of the plurality of cavities respectively, the plurality of light emitting elements are in one-to-one correspondence with the plurality of sub-pixel color filters of the color filter layer respectively, and the black matrix is on a side of the pixel definition layer facing the color filter layer.

In some embodiments, an orthographic projection of each sub-pixel color filter of the plurality of sub-pixel color filters on the base substrate covers an orthographic projection of one of the plurality of light emitting elements corresponding to the sub-pixel color filter on the base substrate.

In some embodiments, the black matrix comprises a plurality of black matrix openings in one-to-one correspondence with the plurality of light emitting elements respectively, and an orthographic projection of one of the plurality of light emitting elements on the base substrate does not exceed an orthographic projection of one of the plurality of black matrix openings corresponding to the one of the plurality of light emitting elements on the base substrate.

In some embodiments, each light emitting element of the plurality of light emitting elements comprises a light emitting layer, wherein for the light emitting element and corresponding black matrix opening and sub-pixel color filter, a ratio of a second distance to a third height is greater than or equal to a ratio of a first distance to a second height, the first distance is a diameter of an orthographic projection of the black matrix opening on the base substrate, the second height is a distance from the light emitting layer of the light emitting element to an upper surface of the black matrix away from the pixel definition layer in a vertical direction perpendicular to a bottom surface of the base substrate, the third height is a distance from the light emitting layer of the light emitting element to an upper surface of the sub-pixel color filter away from the black matrix in the vertical direction, the second distance is a difference between a diameter of an orthographic projection of the sub-pixel color filter on the base substrate and a gap distance, and the gap distance represents a length of a gap between the orthographic projection of the sub-pixel color filter on the base substrate and the orthographic projection of the black matrix opening on the base substrate in a direction of the diameter of the orthographic projection of the sub-pixel color filter on the base substrate.

In some embodiments, the orthographic projection of the sub-pixel color filter on the base substrate and the orthographic projection of the light emitting element corresponding to the sub-pixel color filter on the base substrate are concentric and have a same shape.

In some embodiments, the orthographic projection of the black matrix on the base substrate does not exceed an orthographic projection of the pixel definition layer on the base substrate.

In some embodiments, the display panel further comprises a spacer layer on a side of the black matrix away from the backplane, and an orthographic projection of the spacer layer on the base substrate does not exceed the orthographic projection of the black matrix on the base substrate.

In some embodiments, the orthographic projection of the spacer layer on the base substrate and the orthographic projection of the black matrix on the base substrate are concentric and have a same shape.

In some embodiments, the display panel further comprises a liquid crystal layer between the backplane and the black matrix.

In some embodiments, the display panel further comprises a transparent substrate for carrying the black matrix, and the liquid crystal layer is located between the transparent substrate and the backplane.

In some embodiments, the display panel further comprises a touch layer on a side of the color filter layer away from or facing the backplane.

Another embodiment of the application provides display screen, comprising: a transparent cover plate and the display panel described in any of the foregoing embodiments, the display panel is attached to the transparent cover plate.

A further embodiment of the present application provides a display device comprising the display panel described in any of the foregoing embodiments.

BRIEF DESCRIPTION OF DRAWINGS

By referring to the detailed description of non-limiting embodiments with reference to the drawings below, other features, objectives and advantages of the disclosure will become more apparent. The drawings illustrate some embodiments of the application and related comparative examples.

DETAILED DESCRIPTION OF EMBODIMENTS

Embodiments of the application will be further described in detail below with reference to the accompanying drawings and examples. It can be understood that the specific embodiments described here are only used to explain the principle of the technical solution of the application, rather than to limit the protection scope of the application. In addition, it is to be noted that, to facilitate description, the drawings only show the structures or steps related to the technical solution of the application, rather than all the components of the display panel.

It is to be noted that, without causing any conflict, embodiments described herein and features in the embodiments can be combined with each other to obtain other different embodiments, and these other different embodiments also pertain to the protection scope of the application.

Figure 1:
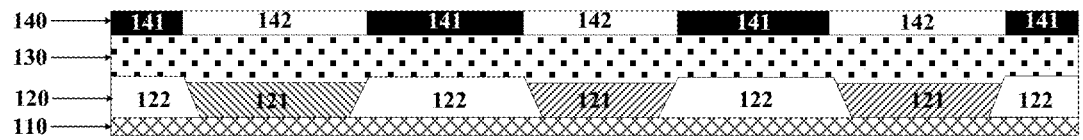
FIG. 1 is a partial sectional view of a display panel provided by a comparative example of the application.

FIG. 1 shows a partial sectional view of a display panel according to a comparative example of the application. The comparative example mentioned herein is a technical solution known to the inventors for comparison with other embodiments. As shown in FIG. 1, the display panel comprises a backplane (BP) 110, a display function layer 120, a thin film encapsulation layer 130 and a color filter layer 140. The display function layer 120 comprises a pixel definition layer 122 and at least one light emitting element 121. The pixel definition layer 122 defines a plurality of cavities, and each light emitting element 121 is arranged in a corresponding cavity. For an OLED display panel, a single light emitting element 121 can be regarded as a sub-pixel. In the example of FIG. 1, the display panel further comprises a color filter layer 140, and the color filter layer 140 comprises a black matrix 141 and a sub-pixel color filter 142 disposed in a black matrix opening corresponding to each light emitting element 121. That is to say, in the example of FIG. 1, the color filter layer 140 has replaced a polarizer element included in a conventional display panel, which can avoid the deficiencies of the polarizer such as large thickness, high stress, and being unfavorable to bending and curling, and is conducive to implementation of a flexible and bendable display panel. Further, experiments show that the application of a color filter layer instead of a polarizer can also lead to a higher transmittance and a wider color gamut.

Figure 2:
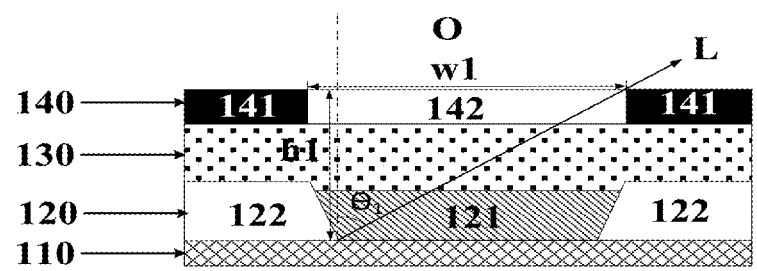
FIG. 2 illustrates a light exit path of light originating from a light emitting element when the display panel of the comparative example shown in FIG. 1 is in operation.

FIG. 2 is a schematic view illustrating a path of light originating from the light emitting element 121 during operation of the display panel shown in FIG. 1, where light L emitted by the sub-pixel 121 can be transmitted through the sub-pixel color filter 142 corresponding to the sub-pixel via a transparent thin film encapsulation layer 130. During the light propagation process, the black matrix 141 around the sub-pixel color filter 142 corresponding to the sub-pixel 121 shields light emitted from the sub-pixel 121 to a certain extent, and a maximum exit angle of the light is $\Theta_1$, which is a maximum angle between the light L emitted by the sub-pixel and a normal direction O perpendicular to a plane of the display panel, $\Theta_1 = \arctan w_1/h_1$, where $w_1$ is a first distance. The first distance is a diameter of an orthographic projection of a black matrix opening (corresponding to a sub-pixel color filter 142) on the backplane 110, or the first distance may be regarded as a diameter of an orthographic projection of a single sub-pixel color filter 142 on the backplane 110. The "diameter" mentioned here and below refers to a distance between two intersection points of a straight line passing through a central point of an orthographic projection and edges of the orthographic projection. $H_1$ is a first height, which is roughly a distance in the normal direction between a sub-pixel color filter and a light emitting layer of the sub-pixel. Due to the arrangement of the black matrix, the display panel has a small light exit angle, resulting in a small viewing angle for the display panel. In case the light emitting element in the display panel is of top emission type, a micro-cavity formed between two electrodes (cathode and anode) of the light emitting element will lead to a result that, when a user views the display panel at a position deviating from the center of the display panel, the image viewed is low in brightness, and the user experience is poor. The above-mentioned viewing angle refers to an angle between the line of sight when the user can clearly view content displayed on the display panel and a vertical direction (i.e., the normal direction) perpendicular to the surface of the display panel.

A display panel provided by another embodiment of the application comprises a backplane, a color filter layer and a black matrix. The backplane comprises a base substrate, the black matrix is located between the backplane and the color filter layer, the color filter layer includes a plurality of sub-pixel color filters, and the plurality of sub-pixel color filters are arranged along a plane of the color filter layer and spliced together. Different from the comparative example shown in FIG. 1, the color filter layer of the display panel provided by this embodiment does not comprise the black matrix, i.e., the sub-pixel color filters are not separated from each other by the black matrix, instead, they are arranged along the plane of the color filter layer and spliced together to form the color filter layer. Therefore, the color filter layer can be regarded as a continuous layer formed only by the material of the color filter layer. In this embodiment, the type of the display panel is not limited. The display panel may be a liquid crystal display panel or an organic light emitting display panel, for example, an organic light emitting diode (OLED) display panel.

Figure 3:
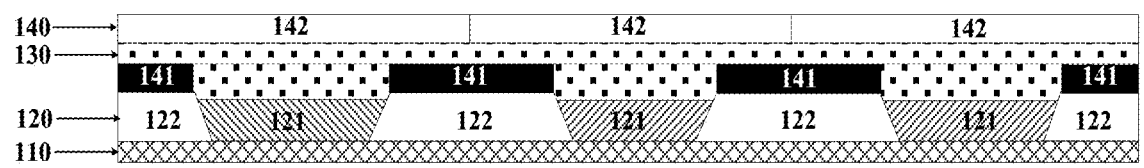
FIG. 3 is a partial sectional view of a display panel provided by an embodiment of the present application.

FIG. 3 illustrates a partial section of a display panel according to an embodiment of the application. As shown in FIG. 3, the display panel 100 comprises a backplane 110 (including a base substrate) and a pixel definition layer 122 on the backplane 110. The pixel definition layer 122 defines a plurality of cavities, and a plurality of light emitting elements 121 (e.g., OLEDs) are arranged in the plurality of cavities respectively. The display panel further comprises a thin film encapsulation layer 130, which is located between the black matrix 141 and the color filter layer 140 and covers the black matrix 141. Specifically, the black matrix 141 is disposed on a side of the pixel definition layer 122 away from the backplane 110, and the black matrix 141 has an area not larger than that of the pixel definition layer 122. For example, an orthographic projection of black matrix 141 on the base substrate of the backplane 110 does not exceed an orthographic projection of the pixel definition layer 122 on the base substrate. The black matrix includes an opaque material. In some embodiments, the display panel is a flexible display panel, and the opaque material comprises an opaque resin material to facilitate the flexibility of the display panel. In addition, the black matrix 141 may act as a spacer layer to fix and support some other layers in the display panel, which may improve the compression and deformation resistance of the display panel.

The color filter layer 140 is disposed on a side of the black matrix 141 away from the backplane 110. The color filter layer 140 comprises sub-pixel color filters 142 arranged in one-to-one correspondence with light emitting elements (sub-pixels) 121. Light emitted by the light emitting layer of the sub-pixel 121 can be transmitted through the sub-pixel color filter 142 corresponding to the sub-pixel 121 via the thin film encapsulation layer 130, which can prevent light emitted by adjacent sub-pixels from being mixed in the color filter layer. The material of the sub-pixel color filter may comprise a color resin material, and the color of the sub-pixel color filter is consistent with the color of light emitted by the light emitting layer of a corresponding sub-pixel. For example, if the light emitting layer of a sub-pixel emits green light, the color of the sub-pixel color filter corresponding to the sub-pixel is green. In other embodiments, the light emitting elements 121 may emit white light, and the white light passes through sub-pixel color filters 142 of different colors, realizing a colorful display of the display panel.

As shown in FIG. 3, the thin film encapsulation layer 130 may be formed of a transparent material and is arranged on a side of the black matrix 141 away from the backplane 110, which can block moisture and oxygen in the environment, and prevent moisture and oxygen from corroding and damaging the display function layer of the display panel. An orthographic projection of the black matrix 141 on the base substrate of the backplane 110 covers an orthographic projection of a boundary between adjacent sub-pixel color filters 142 on the base substrate. Further, the black matrix comprises a plurality of black matrix openings, the plurality of black matrix openings are in one-to-one correspondence with the plurality of light emitting elements 121, and an orthographic projection of the light emitting element 121 on the base substrate of the backplane 110 does not exceed an orthographic projection of the black matrix opening corresponding to the light emitting element 121 on the base substrate.

Figure 4:
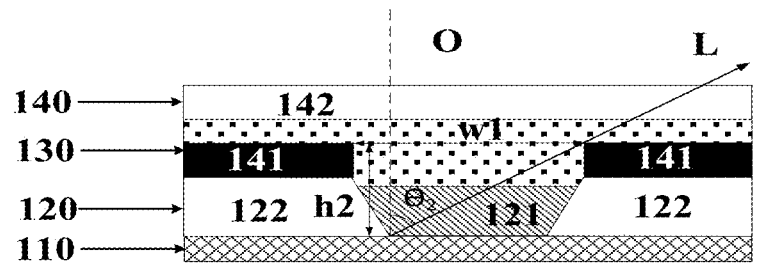
FIG. 4 and FIG. 5 illustrate a light exit path of light originating from a light emitting element when the display panel shown in FIG. 3 is in operation.

As shown in FIG. 4, FIG. 4 is a schematic view illustrating a light path for the light emitting element of the display panel shown in FIG. 3 during an operation process of the display panel, where light emitted by the light emitting layer of a sub-pixel 121 can be transmitted through a sub-pixel color filter 142 corresponding to the sub-pixel. Compared with the display panel shown in FIG. 1, since the color filter layer does not comprise a black matrix, the area of each sub-pixel color filter is increased, and the thicknesses of the black matrix and the thin film encapsulation layer 130 can be varied to enable light emitted by the sub-pixel to have a larger exit angle when passing through the sub-pixel color filter. The exit angle may be represented as $\Theta_2$, which is a maximum angle between light emitted by the light emitting layer of the sub-pixel and the normal direction of the display panel. $\Theta_2 = \arctan w_1/h_2$, where $w_1$ is the first distance, that is, the diameter of the orthographic projection of the black matrix opening on the base substrate of the backplane. However, unlike the example of FIG. 2, the first distance cannot be regarded as the diameter of the orthographic projection of a single sub-pixel color filter 142 on the base substrate, because in the example of FIG. 4, the size of the sub-pixel color filter corresponding to the sub-pixel 121 is larger than the size of the black matrix opening. $h_2$ means a second height, which is a distance from the light emitting layer of the light emitting element to the upper surface of the black matrix 141 away from the pixel definition layer 122 in a vertical direction perpendicular to a bottom surface of the base substrate. By comparing FIG. 2 with FIG. 4, it can be seen that, since the first height $h_1$ is greater than the second height $h_2$, the exit angle $\Theta_2$ shown in FIG. 4 is significantly larger than the exit angle $\Theta_1$ of light emitted by the sub-pixel in the display panel provided by the comparative example shown in FIG. 2, thus the display panel shown in FIG. 4 have a larger viewing angle for the user. Even if in the case of a top emission type display panel, when the user views the display panel from a position not directly in front of the display panel, the brightness of the image viewed will not attenuate, which can further improve the usage experience for the user.

For the display panel provided by an embodiment of the application, the area of the sub-pixel color filter in the color filter layer is larger than the area of the light emitting element corresponding to the sub-pixel color filter. For example, the orthographic projection of the sub-pixel color filter on the base substrate of the backplane 110 covers the orthographic projection of the light emitting element corresponding to the sub-pixel color filter on the base substrate, which can not only increase the exit angle of light emitted by the sub-pixel, but also facilitate transmission of all the light emitted by the sub-pixel through the sub-pixel color filter corresponding to the sub-pixel to prevent the light emitted by the sub-pixel from entering an adjacent sub-pixel color filter which would otherwise result in a color mixing phenomenon. According to some embodiments of the application, the orthographic projection of the sub-pixel color filter on the backplane and the orthographic projection of the light emitting element on the backplane are concentric and have the same shape. Therefore, the distances between edges of the orthographic projection of the sub-pixel color filter on the backplane and edges of the orthographic projection of the corresponding light emitting element on the backplane are basically constant.

Figure 5:
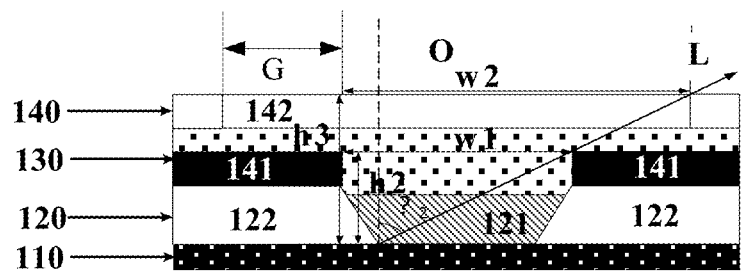

As shown in FIG. 5, in the display panel provided by another embodiment of the application, the ratio of the second distance $w_2$ to the third height $h_3$ is greater than or equal to the ratio of the first distance $w_1$ to the second height $h_2$, the third height $h_3$ is a distance from the light emitting layer of the light emitting element to the upper surface of the sub-pixel color filter 142 away from the black matrix 141 in the vertical direction perpendicular to the bottom surface of the base substrate, the second distance $w_2$ represents a difference between a diameter of the orthographic projection of the sub-pixel color filter 142 on the base substrate and a gap distance (denoted by "G" in FIG. 5), and the gap distance G represents a length of a gap between the orthographic projection of the sub-pixel color filter 142 on the base substrate and the orthographic projection of the black matrix opening on the base substrate in the direction of the diameter of the orthographic projection of the sub-pixel color filter. This can ensure the area of the sub-pixel color filter is large enough, so that light emitted by the light emitting layer of the sub-pixel can be transmitted through a corresponding sub-pixel color filter as much as possible, facilitating a better display effect of the display panel.

Figure 6:
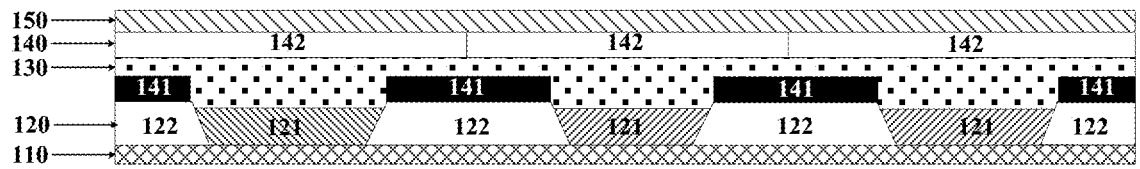
FIG. 6 is a partial sectional view of a display panel provided by another embodiment of the application.

According to a further embodiment of the application, as shown in FIG. 6, the display panel may comprise a protective layer 150. The protective layer 150 is disposed on a side of the color filter layer 140 away from the backplane 110 to prevent the display panel from being damaged by external forces. The material of the protective layer may be transparent organic material, which can avoid blocking light emitted by the sub-pixel and affecting the display effect.

Figure 7:
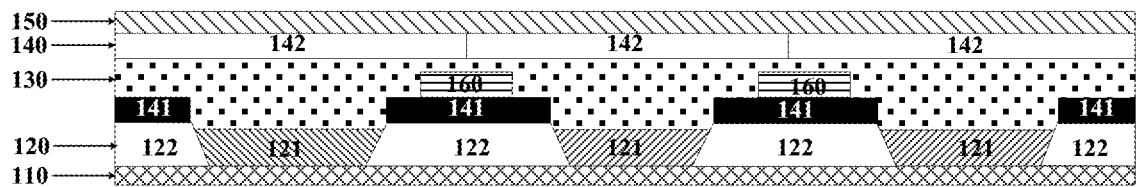
FIG. 7 is a partial sectional view of a display panel provided by a further embodiment of the application.

According to a further embodiment of the application, as shown in FIG. 7, the display panel further comprises a spacer layer 160. The spacer layer 160 is disposed on a side of the black matrix 141 away from the backplane 110 and can cooperate with the black matrix to fix and support the some other layers in the display panel, which further improves the compression and deformation resistance of the display panel. Moreover, an orthographic projection of the spacer layer on the backplane 110 has a smaller area than the orthographic projection of the black matrix 141 on the backplane, for example, the orthographic projection of the spacer layer on the backplane does not exceed the orthographic projection of the black matrix on the backplane, so as to prevent the spacer layer from blocking light emitted by the sub-pixel, and ensure that the display panel has a relatively large viewing angle. The material of the spacer layer may include a transparent polymer material with toughness and rigidity, or the material of the spacer layer is the same as that of the black matrix. During the manufacturing process of the display panel, the black matrix and the spacer layer may be formed by means of a single mask to reduce the process procedures and achieve the anti-deformation and anti-compression effect. According to some embodiments of the disclosure, the orthographic projection of the spacer layer on the base substrate of the backplane and the orthographic projection of the black matrix on the base substrate are concentric and have the same shape, which can reduce the process difficulty.

Figure 8:
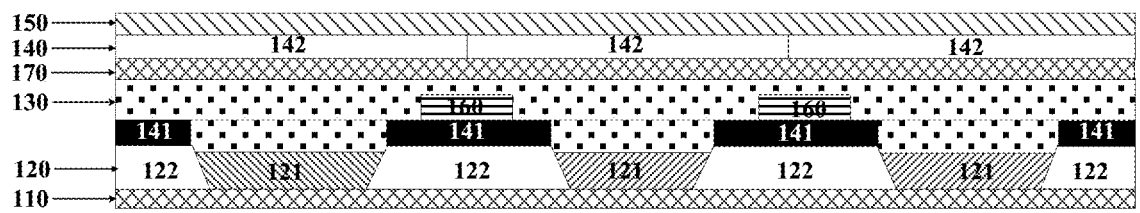
FIG. 8 is a partial sectional view of a display panel provided by a further embodiment of the application.

According to some embodiments of the application, the display panel may comprise a touch layer, and the touch layer is disposed on a side of the color filter layer facing or away from the backplane of the display panel. As shown in FIG. 8, FIG. 8 illustrates a schematic view of a display panel with touch function, in which a touch layer 170 is disposed on a side of the color filter layer 140 facing the backplane 110.

Figure 9:
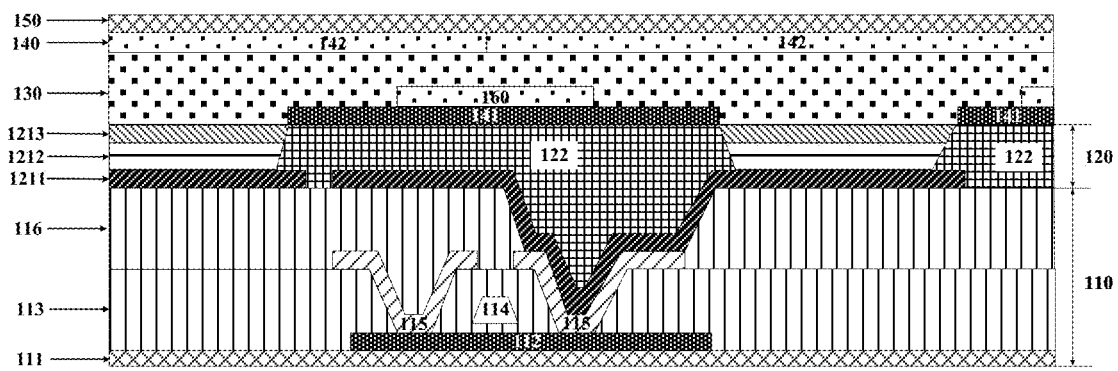
FIG. 9 is a partial sectional view of a display panel provided by a further embodiment of the application.

As shown in FIG. 9, FIG. 9 illustrates a schematic view of a display panel provided by a further embodiment of the application. The backplane 110 in the display panel comprises a base substrate (e.g., a flexible substrate) 111, and a silicon-based substrate 112, a first planarization layer 113 and a gate layer 114. The first planarization layer 113 is provided with a via hole, a source/drain layer 115 is connected to the silicon-based substrate 112 through the via hole, and a second planarization layer 116 is disposed on a side of the source/drain layer 115 away from the flexible substrate 111.

Continuing to refer to FIG. 9, the display panel further comprises a display function layer 120, and the display function layer 120 comprises a plurality of first electrode layers 1211 arranged at intervals and a pixel definition layer 122 which are disposed on a side of the source/drain layer 115 away from the flexible substrate 111. The pixel definition layer 122 includes a plurality of cavities in one-to-one correspondence with the plurality of first electrode layers 1211. The cavity is provided with a light emitting layer 1212 and a second electrode layer 1213. The first electrode layer 1211, the light emitting layer 1212, and the second electrode layer 1213 in each cavity form a major component of a single light emitting element (for an organic light emitting display panel, a single light emitting element can be regarded as a single sub-pixel).

The display panel further comprises a black matrix 141 and a spacer layer 160. The black matrix 141 is disposed on a side of the pixel definition layer 122 away from the backplane 110. The spacer layer 160 is disposed on a side of the black matrix 141 away from the backplane 110.

The display panel further comprises a thin film encapsulation layer 130, a color filter layer 140 and a protective layer 150. The thin film encapsulation layer 130 is disposed on a side of the spacer layer away from the backplane, the color filter layer 140 is disposed on a side of the thin film encapsulation layer 130 away from the backplane 110, and the protective layer 150 is disposed on a side of the color filter layer 140 away from the backplane 110. The color filter layer 140 includes sub-pixel color filters 142 arranged in one-to-one correspondence with the sub-pixels. The thin film encapsulation layer 130 may include a first inorganic encapsulation layer, an organic encapsulation layer and a second inorganic encapsulation layer arranged successively on a side of the spacer layer 160 away from the backplane 110. The organic encapsulation layer can isolate moisture and oxygen, and the inorganic encapsulation layer has a certain degree of hardness, which can prevent the thin film encapsulation layer from being damaged during operation of the display panel.

Figure 10:
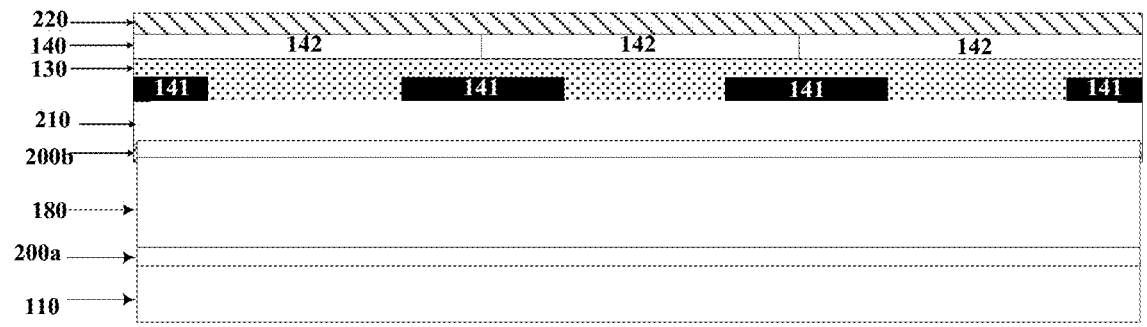
FIG. 10 is a partial sectional view of a display panel provided by yet another embodiment of the application.

FIG. 10 schematically shows a partial sectional view of a display panel provided by a further embodiment of the application. As shown in FIG. 10, the display panel comprises a backplane 110, a liquid crystal layer 180, a black matrix 141, a thin film encapsulation layer 130, a color filter layer 142 and an upper substrate 220. In this embodiment, the backplane 110 may be an array substrate, that is, the backplane 110 may comprise a base substrate (which may be referred to as a lower substrate in this embodiment) and a pixel circuit formed on the base substrate for controlling deflection of liquid crystal molecules in the liquid crystal layer 180. The upper substrate 220 may be a glass substrate. The display panel further comprises alignment films 200a and 200b located on two sides of the liquid crystal layer 180 respectively, and a transparent substrate 210 for carrying the black matrix 141. It can be understood that FIG. 10 only illustrates part of the components of the display panel. In other words, the display panel may comprise any other elements known to those skilled in the art that are necessary to realize normal display functions, which will not be described in detail here.

According to the display panel provided by the embodiment of the application, the color filter layer 140 includes a plurality of sub-pixel color filters 142. The sub-pixel color filters 142 are in one-to-one correspondence with a plurality of sub-pixel (e.g., R sub-pixel, G sub-pixel and B sub-pixel) regions of the display panel respectively. The sub-pixel color filters are arranged along the plane of the color filter layer and spliced together to form the color filter layer. The color filter layer 140 can be regarded as a continuous uninterrupted layer formed of a color filter material. In a conventional liquid crystal display panel, the color filter layer and the black matrix are basically in the same layer, and the sub-pixel color filters are separated from each other by the black matrix. Based on the principles discussed above with reference to FIGS. 2 and 4, the display panel provided by this embodiment has a larger viewing angle compared to a conventional liquid crystal display panel, which can improve the image quality when the user views the displayed image at a position deviating from the center position of the display panel (i.e., a position not directly in front of the display panel), thereby enhancing user experience for the display device.

Figure 11:
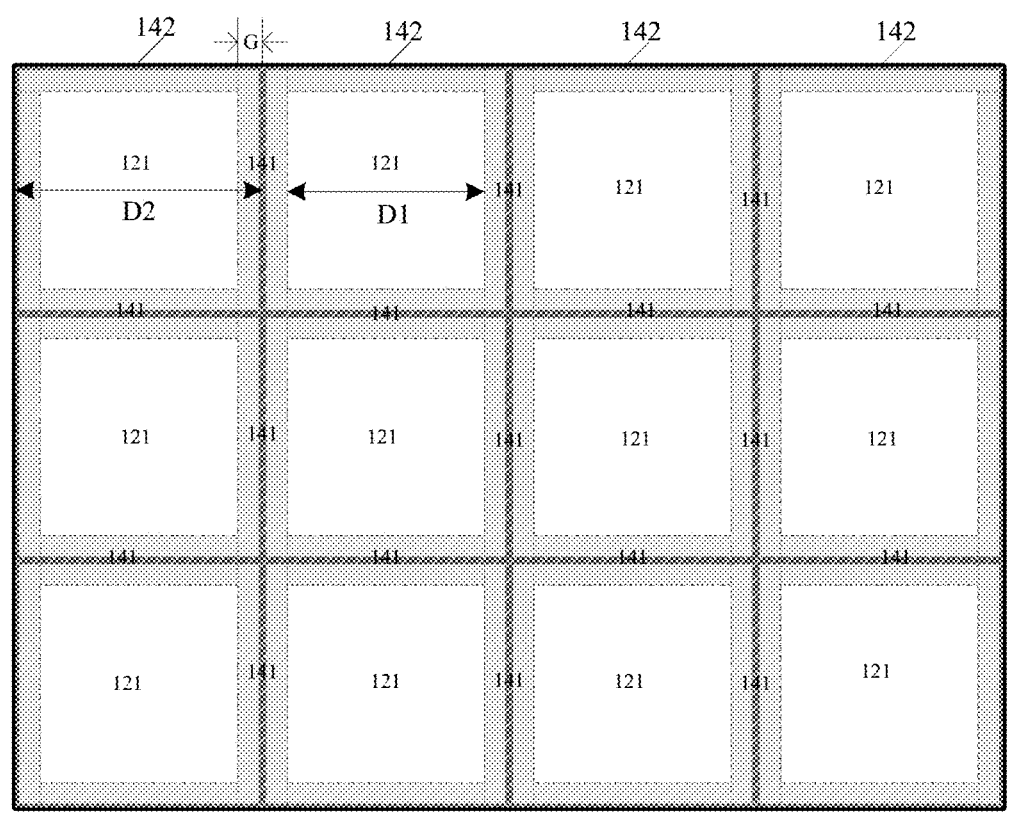
FIG. 11 is a partial top view of a display panel provided by yet another embodiment of the application.

In order to more clearly understand some technical features regarding the display panel described in the foregoing embodiments, FIG. 11 illustrates a partial top perspective view of the display panel according to an embodiment of the application. In this example, each sub-pixel color filter exhibits a rectangular shape. As shown in FIG. 11, the region of the orthographic projection of each sub-pixel color filter 142 on the base substrate of the backplane is represented by a rectangular region formed by thick lines in FIG. 11, the region of the orthographic projection of the light emitting element 121 on the base substrate is shown as a white dotted frame region in FIG. 11, and the shaded gray region in FIG. 11 represents the orthographic projection of the black matrix 141 on the base substrate. It can be seen from FIG. 11 that the orthographic projection of the black matrix 141 on the base substrate covers the orthographic projection of the boundary between adjacent sub-pixel color filters 142 on the base substrate, and the orthographic projection of each sub-pixel color filter 142 on the base substrate covers the orthographic projection of the light emitting element 121 corresponding to the sub-pixel color filter on the base substrate. The orthographic projection of the light emitting element 121 on the base substrate does not exceed the orthographic projection of the black matrix opening corresponding to the light emitting element on the base substrate. In this example, the black matrix opening is of a square shape, and the diameter (i.e., the aforementioned first distance) of the orthographic projection of the black matrix opening on the base substrate is the length of a line segment between two opposite sides of the square and passing through the center point of the square black matrix opening, as denoted by D1 in FIG. 11, for example. FIG. 11 also illustrates an example D2 of the diameter of the orthographic projection of the sub-pixel color filter on the base substrate, and an example G of the aforementioned gap distance.

Figure 12:
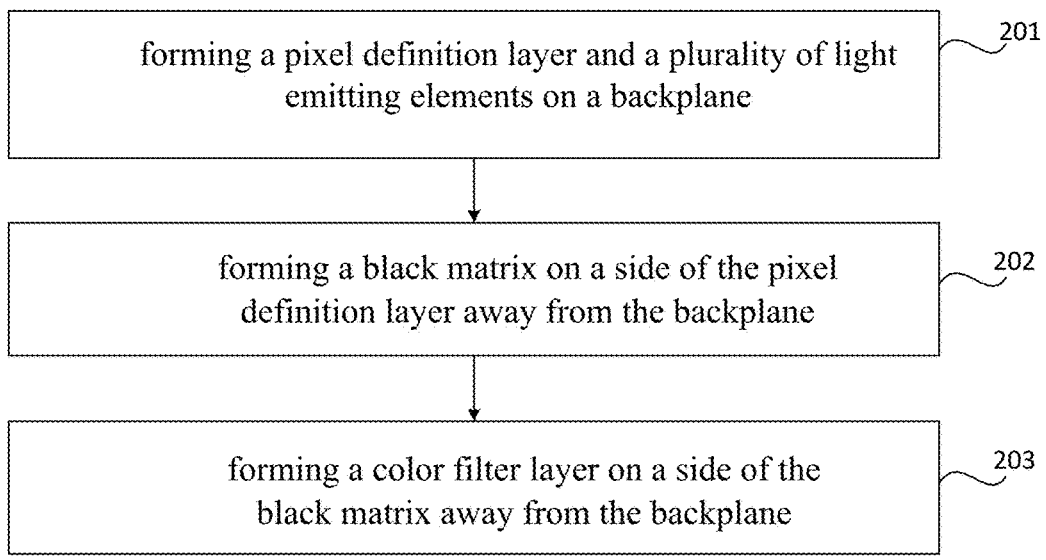
FIG. 12 is a flowchart of a method of manufacturing a display panel provided by an embodiment of the application.

A further embodiment of the application provides a method of manufacturing a display panel. As shown in FIG. 12, the method comprises the following steps:

Step 201: forming a pixel definition layer and a plurality of light emitting elements on a backplane.

Figure 13:
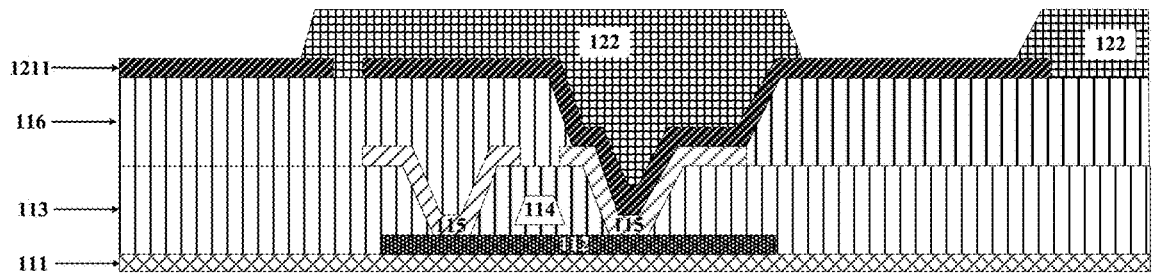
FIGS. 13-17 illustrate a partial sectional view of a display panel provided by an embodiment of the application during different manufacturing steps.

In this step, as shown in FIG. 13, a first electrode layer is conformally formed on the backplane by deposition, coating or sputtering, etc. so that the first electrode layer is connected to a source/drain layer 115 in the backplane. The first electrode layer is patterned into at least one first electrode layer 1211 arranged at intervals, and the at least one first electrode layer act as the first electrode layer of the light emitting element in the display panel.

Further, a pixel definition layer is formed on the backplane 110 by deposition, coating or sputtering, etc., and an opening is formed in the pixel definition layer through a patterning process to expose a part of the first electrode layer 1211. The opening forms a cavity in the pixel definition layer, i.e., a position where the light emitting element is located. For the structure of the backplane, reference may be made to the example shown in FIG. 9 of the foregoing embodiment, which will not be described in detail in this embodiment.

Step 202: forming a black matrix on a side of the pixel definition layer away from the backplane.

Figure 14:
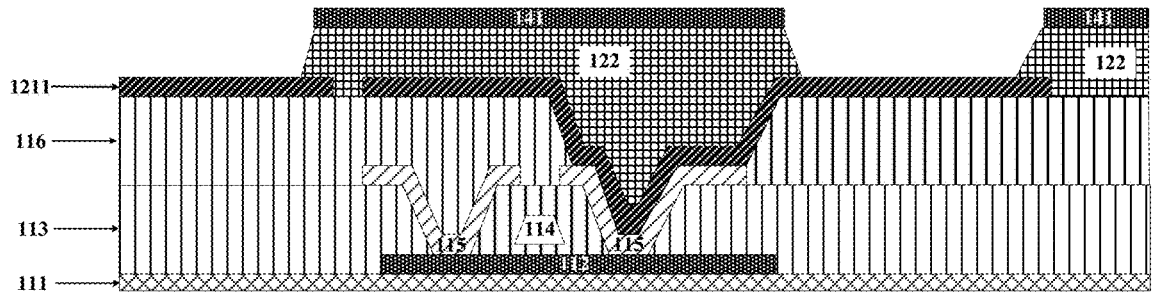

In this step, as shown in FIG. 14, a black matrix material layer is formed on a side of the pixel definition layer 122 away from the backplane by deposition, coating or sputtering, etc., and a black matrix 141 in correspondence with the pixel definition layer are formed by a patterning process, the orthographic projection of the black matrix on the base substrate 111 does not exceed the orthographic projection of the pixel definition layer on the base substrate 111.

Figure 15:
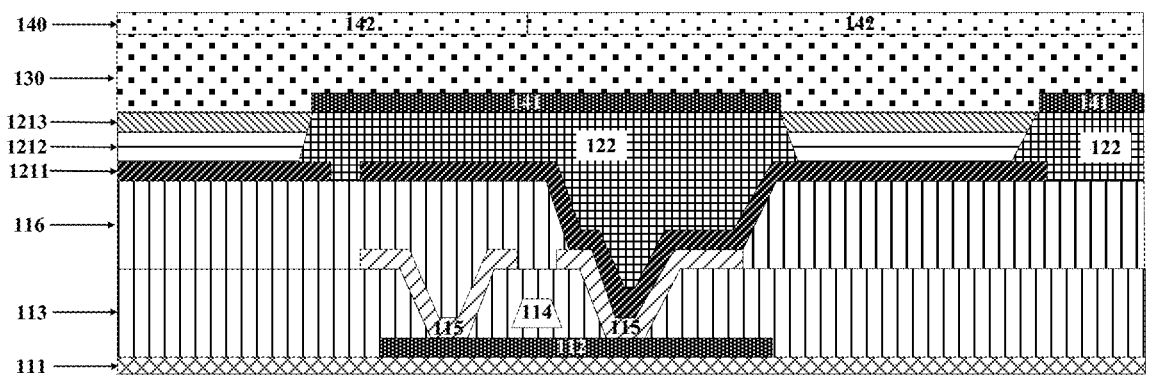

In the embodiment of the application, after the black matrix is formed, as shown in FIG. 15, a light emitting layer 1212 and a second electrode layer 1213 are formed in the cavity of the pixel definition layer 122, which cover the first electrode layer 1211 exposed by the cavity of the pixel definition layer. The process for forming the light emitting layer and the second electrode layer may be an evaporation process.

Figure 16:
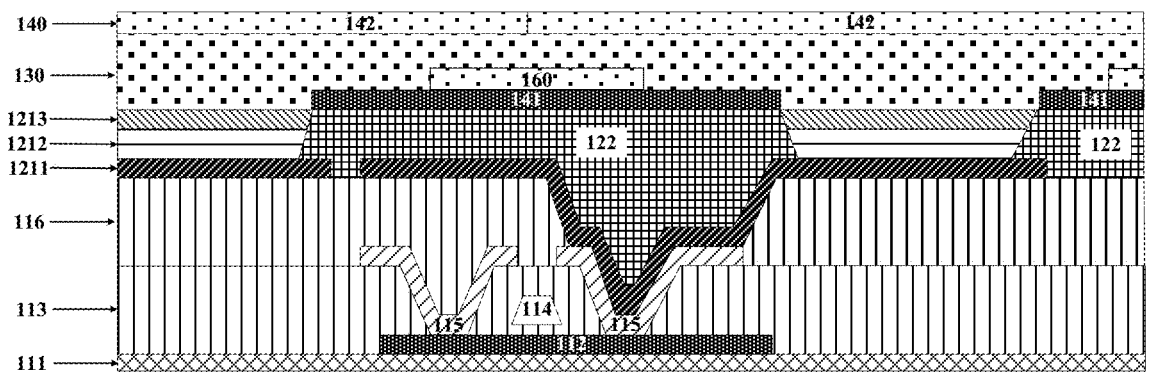

In order to further improve the compression and deformation resistance of the display panel, according to some embodiments of the application, after the above step 202, as shown in FIG. 16, a spacer layer 160 is formed on a side of the black matrix 141 away from the backplane by deposition, coating or sputtering, etc., a patterning process is employed to make the area of the orthographic projection of the spacer layer on the base substrate 1110 smaller than or equal to that of the orthographic projection of the black matrix 141 on the base substrate 111, so as to avoid blocking light emitted by the sub-pixel.

In some embodiment of the application, the material of the spacer layer may be the same as the material of the black matrix, thus the black matrix layer and the spacer layer may be formed by the same patterning process, which reduces the process procedures and improves the production efficiency of the display panel.

Further, in order to facilitate extension of the lifetime of the display function layer of the display panel, in some embodiments, as shown in FIG. 15, a thin film encapsulation layer 130 may be formed on a side of the black matrix 141 away from the backplane. As shown in FIG. 16, a thin film encapsulation layer 130 may be formed on a side of the spacer layer 160 away from the backplane. The thin film encapsulation layer typically includes a first inorganic encapsulation layer, an organic encapsulation layer, and a second inorganic encapsulation layer. The first inorganic encapsulation layer may be formed by deposition on a side of the black matrix away from the flexible substrate by a chemical vapor deposition process, the organic encapsulation layer may be further formed by an inkjet printing process, and finally, the second inorganic encapsulation layer is formed by means of the chemical vapor deposition process.

Step 203: forming a color filter layer on a side of the black matrix away from the backplane.

In the embodiment of the application, the color filter layer includes sub-pixel color filters in one-to-one correspondence with light emitting elements, and light emitted by the light emitting layer of a light emitting element can be transmitted through a sub-pixel color filter corresponding to the light emitting element.

In this step, as shown in FIGS. 15 and 16, red, green and blue sub-pixel color filters 142 can be formed on the thin film encapsulation layer 130. The process can comprise forming sub-pixel color filters of different colors successively on the thin film encapsulation layer by an edge exposure process. It is to be noted that the embodiment does not limit the order of forming the sub-pixel color filters of different colors. For example, red sub-pixel color filters may be firstly formed, green sub-pixel color filters are then formed, and blue sub-pixel color filters are finally formed, or red sub-pixel color filters may be firstly formed, blue sub-pixel color filters are then formed, and green sub-pixel color filters are finally formed.

Further, in order to protect the display panel from being damaged from external forces, as shown in FIG. 9, a protective layer 150 may be formed by deposition, coating or sputtering, etc. on a side of the color filter layer away from the backplane.

Figure 17:
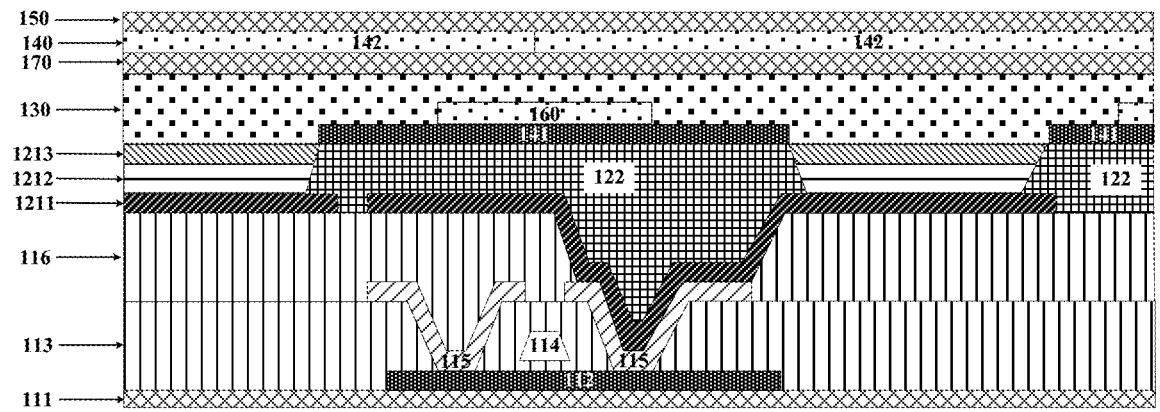

According to some embodiments of the application, in order to enable the display panel to have a touch function, prior to forming the color filter layer, a touch layer may be fabricated on a side of the thin film encapsulation layer away from the backplane by a FMLOC process, or after forming the color filter layer, a touch control layer may be fabricated on a side of the color filter layer away from the backplane by the FMLOC process. The display panel shown in FIG. 17 is a display panel with a touch function, the touch layer 170 is disposed on a side of the color filter layer 140 facing the backplane.

The patterning process mentioned in the embodiment may include a photolithography process (also called a patterning process) performed using a gray-scale mask, including the procedures such as photoresist coating, exposure, development, etching, photoresist stripping, etc.

In summary, the method of manufacturing a display panel provided by the embodiment of the application comprises: forming a pixel definition layer and a plurality of light emitting elements on a backplane; forming a black matrix on a side of the pixel definition layer away from the backplane; forming a color filter layer on a side of the black matrix away from the backplane. By disposing the black matrix on the pixel definition layer, the exit angle of light emitted by the light emitting layer of the light emitting element is increased, so that the viewing angle of the display panel is increased.

Figure 18:
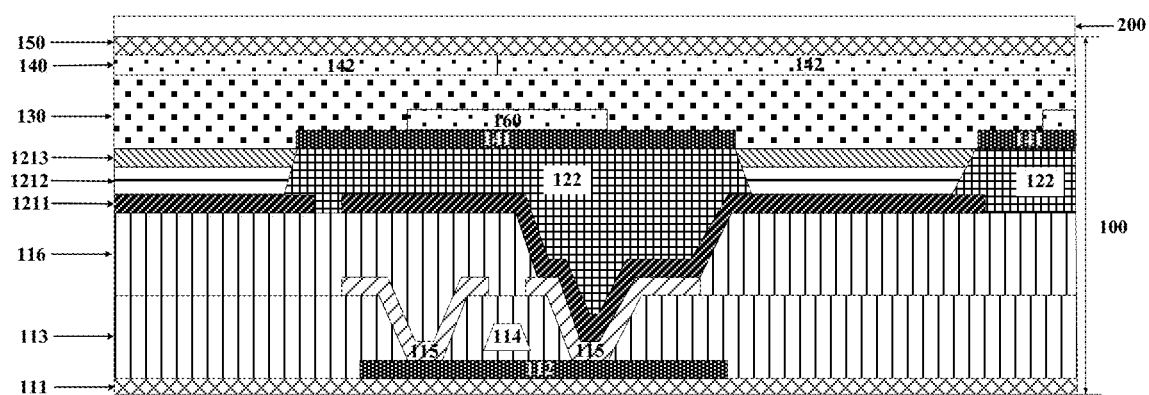
FIG. 18 is a partial sectional view of a display screen provided by an embodiment of the application.

A further embodiment of the application provides a display screen. As shown in FIG. 18, the display screen comprises a transparent cover plate 200 and a display panel 100 provided by any of the foregoing embodiments. The display panel 100 is attached to the transparent cover plate 200. The transparent cover plate may be a 3D plate such as a curved cover plate, or the transparent cover plate may be a flat cover plate.

In an embodiment of the application, during the process of attaching the transparent cover plate to the display panel, the adhesive used may be an optically transparent adhesive, which is advantageous to the display effect of the display screen.

It can be understood that since the display screen provided by this embodiment of the application comprises the display panel described in the foregoing embodiment, it can achieve the same technical effect as the display panel described in the foregoing embodiments, that is, the exit angle of light emitted by the light emitting layer of the light emitting element is increased, so that the viewing angle of the display screen is increased.

Yet another embodiment of the application provides a display device that comprises the display panel provided by any of the foregoing embodiments. Examples of display devices include, but are not limited to, any electronic devices with a display function, such as televisions, mobile phones, computer displays, electronic readers, and the like.

What has been stated above are only some exemplary embodiments of the application. Those skilled in the art should understand that the scope as claimed by the application is not limited to the technical solutions formed by specific combinations of the technical features described above, and shall also cover other technical solutions formed by arbitrarily combining the above technical features or their equivalent features without departing from the inventive concept revealed by the disclosure.

The invention claimed is:

1. A display panel, comprising:
    a backplane comprising a base substrate;
    a color filter layer; and
    a black matrix between the backplane and the color filter layer,
    wherein the color filter layer comprises a plurality of sub-pixel color filters, and the plurality of sub-pixel color filters are arranged along a plane of the color filter layer and spliced together to form the color filter layer,
    wherein the backplane further comprises a pixel definition layer and a plurality of light emitting elements on the base substrate, the pixel definition layer defines a plurality of cavities, respective ones of the plurality of light emitting elements are in respective ones of the plurality of cavities respectively,
    wherein the black matrix is on a side of the pixel definition layer facing the color filter layer and directly contacts the pixel definition layer,
    wherein respective ones of the plurality of sub-pixel color filters are not separated from each other by the black matrix, such that the color filter layer is a continuous layer formed of a color filter material,
    wherein the pixel definition layer comprises a first bottom surface facing the backplane and a first uppermost surface opposite to the first bottom surface, the black matrix comprises a second lowermost surface directly contacting the first uppermost surface of the pixel definition layer and a second top surface opposite to the second lowermost surface, such that the black matrix is stacked on the first uppermost surface of the pixel definition layer in a vertical direction perpendicular to a bottom surface of the base substrate,
    wherein an orthographic projection of the second lowermost surface of the black matrix on the base substrate covers an orthographic projection of the first uppermost surface of the pixel definition layer on the base substrate, and wherein the display panel further comprises a spacer layer on a side of the black matrix away from the backplane, the spacer layer directly contacts the black matrix, an area of an orthographic projection of the spacer layer on the base substrate is smaller than an area of an orthographic projection of the black matrix on the base substrate, and the orthographic projection of the spacer layer on the base substrate is within the orthographic projection of the black matrix on the base substrate, wherein the display panel further comprises a thin film encapsulation layer, the thin film encapsulation layer is between the black matrix and the color filter layer and covers the black matrix and the spacer layer, wherein the thin film encapsulation layer directly contacts each of the black matrix, the spacer layer and the color filter layer.

2. The display panel according to claim 1, wherein the orthographic projection of the black matrix on the base substrate covers an orthographic projection of a boundary between adjacent sub-pixel color filters of the plurality of sub-pixel color filters on the base substrate.

3. The display panel according to claim 2,
wherein the plurality of light emitting elements are in one-to-one correspondence with the plurality of sub-pixel color filters of the color filter layer respectively.

4. The display panel according to claim 3, wherein an orthographic projection of each sub-pixel color filter of the plurality of sub-pixel color filters on the base substrate covers an orthographic projection of one of the plurality of light emitting elements corresponding to a respective sub-pixel color filter of the plurality of sub-pixel color filters on the base substrate.

5. The display panel according to claim 4, wherein the black matrix comprises a plurality of black matrix openings in one-to-one correspondence with the plurality of light emitting elements respectively, and an orthographic projection of one of the plurality of light emitting elements on the base substrate does not exceed an orthographic projection of one of the plurality of black matrix openings corresponding to the one of the plurality of light emitting elements on the base substrate.

6. The display panel according to claim 5,
wherein each light emitting element of the plurality of light emitting elements comprises a light emitting layer,
wherein for the light emitting element and corresponding black matrix opening and sub-pixel color filter, a ratio of a second distance to a third height is greater than or equal to a ratio of a first distance to a second height,
wherein the first distance is a diameter of an orthographic projection of the black matrix opening on the base substrate,
wherein the second height is a distance from the light emitting layer of the light emitting element to an upper surface of the black matrix away from the pixel definition layer in the vertical direction perpendicular to a bottom surface of the base substrate,
wherein the third height is a distance from the light emitting layer of the light emitting element to an upper surface of the sub-pixel color filter away from the black matrix in the vertical direction,
wherein the second distance is a difference between a diameter of an orthographic projection of the sub-pixel color filter on the base substrate and a gap distance, and wherein the gap distance represents a length of a gap between the orthographic projection of the sub-pixel color filter on the base substrate and the orthographic projection of the black matrix opening on the base substrate in a direction of the diameter of the orthographic projection of the sub-pixel color filter on the base substrate.

7. The display panel according to claim 4, wherein the orthographic projection of the sub-pixel color filter on the base substrate and the orthographic projection of a respective one of the light emitting elements corresponding to the sub-pixel color filter on the base substrate are concentric and have a same shape.

8. The display panel according to claim 3, wherein the orthographic projection of the black matrix on the base substrate does not exceed an orthographic projection of the pixel definition layer on the base substrate.

9. The display panel according to claim 1, wherein the orthographic projection of the spacer layer on the base substrate and the orthographic projection of the black matrix on the base substrate are concentric and have a same shape.

10. The display panel according to claim 1, wherein the display panel further comprises a liquid crystal layer between the backplane and the black matrix.

11. The display panel according to claim 10,
wherein the display panel further comprises a transparent substrate for carrying the black matrix, and
wherein the liquid crystal layer is between the transparent substrate and the backplane.

12. The display panel according to claim 1, wherein the display panel further comprises a touch layer on a side of the color filter layer away from or facing the backplane.

13. A display screen, comprising:
a transparent cover plate; and
the display panel according to claim 1,
wherein the display panel is attached to the transparent cover plate.

14. A display device comprising the display panel according to claim 1.

15. The display device according to claim 14,
wherein the display panel further comprises a thin film encapsulation layer, and
wherein the thin film encapsulation layer is between the black matrix and the color filter layer and covers the black matrix.

16. The display device according to claim 14, wherein the orthographic projection of the black matrix on the base substrate covers an orthographic projection of a boundary between adjacent sub-pixel color filters of the plurality of sub-pixel color filters on the base substrate.

17. The display device according to claim 16,
wherein the plurality of light emitting elements are in one-to-one correspondence with the plurality of sub-pixel color filters of the color filter layer respectively.

18. The display device according to claim 17, wherein an orthographic projection of each sub-pixel color filter of the plurality of sub-pixel color filters on the base substrate covers an orthographic projection of one of the plurality of light emitting elements corresponding to respective the sub-pixel color filter on the base substrate.

* * * * *